(12) United States Patent
Breslau

(10) Patent No.: US 8,055,483 B1
(45) Date of Patent: Nov. 8, 2011

(54) SYSTEM AND METHOD FOR PERFORMING HYBRID EXPRESSION EVALUATION

(75) Inventor: Jason Breslau, Littleton, MA (US)

(73) Assignee: The MathWorks, Inc., Natick, MA (US)

( * ) Notice: Subject to any disclaimer, the term of this patent is extended or adjusted under 35 U.S.C. 154(b) by 1540 days.

(21) Appl. No.: 11/289,160

(22) Filed: Nov. 28, 2005

(51) Int. Cl.
G06F 7/60 (2006.01)
G06F 17/10 (2006.01)
G06F 17/50 (2006.01)

(52) U.S. Cl. ............... 703/2; 703/13; 703/19
(58) Field of Classification Search ........... 703/19
See application file for complete search history.

(56) References Cited

U.S. PATENT DOCUMENTS
2002/0194073 A1* 12/2002 Otsuka et al. ............ 705/16

OTHER PUBLICATIONS
Mathworks, Inc. "Using Simulink Version 5", 2002, 476 pages.*

* cited by examiner

Primary Examiner — Kamini S Shah
Assistant Examiner — Suzanne Lo
(74) Attorney, Agent, or Firm — Nelson Mullins Riley & Scarborough LLP

(57) ABSTRACT

A mechanism for evaluating hybrid expressions which allows access to more than one modeling domain is discussed. The present invention allows an evaluation of a portion of a hybrid expression in a first modeling domain. Following the evaluation of the portion of the hybrid expression specific to the first modeling domain, at least a portion of the remainder of the hybrid expression is provided to a second modeling domain for further evaluation.

18 Claims, 3 Drawing Sheets

SYSTEM AND METHOD FOR PERFORMING HYBRID EXPRESSION EVALUATION

FIELD OF THE INVENTION

The illustrative embodiment of the present invention relates generally to the initialization of graphical models, and more particularly to the evaluation of hybrid expressions.

BACKGROUND

Simulation of graphical models is an important tool in the design and analysis of physical systems. Simulation enables the studying of system behavior, the automatic performing of optimizations, and the evaluation of system analysis algorithms, among other uses. Various classes of graphical models describe computations that can be performed on application specific computational hardware, such as a computer, microcontroller, FPGA, and custom hardware. Classes of such graphical models include time-based block diagrams such as those found within Simulink® from the MathWorks, Inc. of Natick Mass., state-based and flow diagrams such as those found within Stateflow® from the MathWorks, Inc. and dataflow diagrams. A common characteristic among these various forms of graphical models is that they define semantics on how to execute the model.

During the initialization phase of a graphical model that occurs prior to the execution/simulation of a graphical model, each model component is analyzed. Many model components correspond to underlying code that is evaluated in order to initialize the model. The underlying code expression is evaluated in light of the modeling domain to which it corresponds. For example, for a statechart environment, the expression being evaluated must contain numeric constants, statechart constants, statechart parameters, and references to the size of other statechart data. Following the evaluation of all of the underlying expressions corresponding to the model components, the graphical model may be simulated or executed.

Unfortunately, conventional mechanisms for evaluating expressions do not lend themselves to heterogeneous computing environments where hybrid expressions include references to more than one type of modeling domain. For example, in a statechart environment, an expression conventionally cannot contain an inherited size from a block diagram modeling domain. As a result, the ability to integrate model components from different types of modeling domains is limited.

BRIEF SUMMARY

The illustrative embodiment of the present invention provides a mechanism for evaluating hybrid expressions which allows access to more than one modeling domain. The present invention allows an evaluation of a portion of a hybrid expression in a first modeling domain. Following the evaluation of the portion of the hybrid expression specific to the first modeling domain, at least a portion of the remainder of the hybrid expression is provided to a second modeling domain for further evaluation.

In one embodiment, a method of performing hybrid expression evaluation includes providing a first and second modeling domain. The method further includes the evaluation of a first part of a hybrid expression in the first modeling domain using a first resolution facility. The hybrid expression includes at least one expression element from each of the first and second modeling domains. Additionally, the method provides the results of the evaluation of the first part of the hybrid expression and at least a portion of the remainder of the hybrid expression to a second modeling domain. The method also evaluates a second part of the hybrid expression from the remainder of the hybrid expression in the second modeling domain.

In another embodiment, a system for performing hybrid expression evaluation includes a first modeling domain. The first modeling domain includes a first resolution facility that evaluates a first part of a hybrid expression. The hybrid expression includes at least one expression element from the first modeling domain and a second modeling domain. The system further includes a second modeling domain which receives the results of the evaluation of the first part of the hybrid expression and at least a portion of the remaining non-evaluated portion of the hybrid expression. The second modeling domain evaluates a second part of the remainder of the hybrid expression with a second resolution facility.

In another embodiment, a method of performing hybrid expression evaluation includes providing a first and second modeling domain. The method also includes the step of evaluating the first part of a hybrid expression in the first modeling domain using a first resolution facility. The hybrid expression includes at least one expression element from each of the first and second modeling domains. The method additionally includes the step of providing at least a portion of the remainder of the hybrid expression that has not been evaluated in the first modeling domain to the second modeling domain. The method also evaluates a second part of the hybrid expression from the remaining non-evaluated portion of the hybrid expression in the second modeling domain and returns the result of the evaluation of the second part of the hybrid expression back to the first modeling domain.

In one embodiment, a method of performing hybrid expression evaluation, includes the step of providing a hybrid expression. The hybrid expression has at least a first element written in a first programming language and a second element written in a second programming language. The method evaluates the first element of the hybrid expression using a first resolution facility and then provides the results of the evaluation of the first element of the hybrid expression and at least the second element of the hybrid expression to a second resolution facility. The method also evaluates the second element of the hybrid expression with the second resolution facility.

BRIEF DESCRIPTION OF THE DRAWINGS

The invention is pointed out with particularity in the appended claims. The advantages of the invention described above, as well as further advantages of the invention, may be better understood by reference to the following description taken in conjunction with the accompanying drawings, in which:

DETAILED DESCRIPTION

The ability to utilize data and variables from multiple modeling domains during the design of a system provides a designer an efficient mechanism for designing and simulating real-world systems. Variables and data developed in a first modeling domain may be leveraged to expedite the development of a model in a second modeling domain. The illustrative embodiment of the present invention allows hybrid expressions that contain expressions from multiple modeling domains to be evaluated. Expression resolution facilities in the respective modeling domains receive the domain-specific portions of the hybrid expression for resolution. For example, the first part of a hybrid expression may be evaluated in a statechart modeling domain and a second part in a 'time-based' block diagram modeling domain. The ability to integrate multiple modeling domains provides increased flexibility and efficiency to the design and simulation processes.

Figure 1:
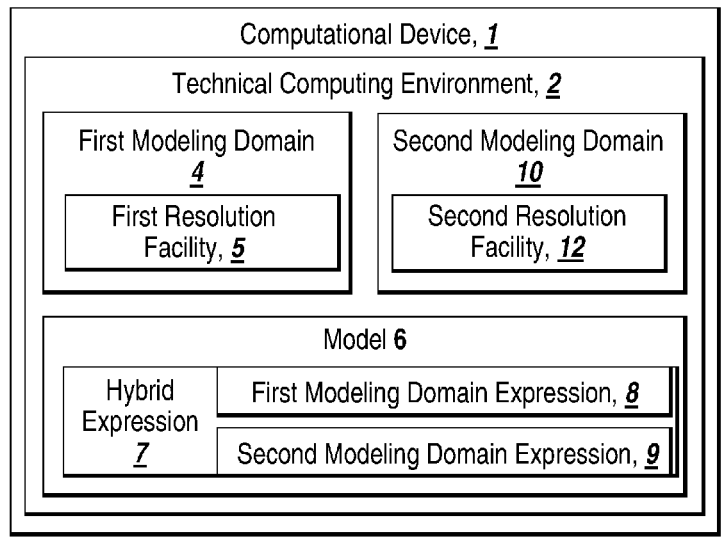
FIG. 1 depicts an environment suitable for practicing the illustrative embodiment of the present invention.

FIG. 1 depicts an environment suitable for practicing the illustrative embodiment of the present invention. A computational device 1 may host a technical computing environment 2. The computational device 1 may be a server, workstation, stand-alone PC, laptop, PDA or other computational device equipped with a processor and capable of supporting the technical computing environment 2. The technical computing environment 2 provides access to a first modeling domain 4 and a second modeling domain 10. The first modeling domain 4 includes a first resolution facility 6. The second modeling domain 10 includes a second resolution facility 12. The technical computing environment 2 includes at least one model 6 that has at least one hybrid expression 7. The hybrid expression 7 includes at least one expression from each of the first modeling domain 4 and the second modeling domain 10.

By way of illustration, the technical computing environment 2 in FIG. 1 may be MATLAB. The first modeling domain 4 may be a statechart domain such as STATEFLOW and the second modeling domain 10 may be a block diagram domain such as SIMULINK.

MATLAB is a high-level technical computing language and interactive environment for algorithm development, data visualization, data analysis, and numeric computation. Using MATLAB, it is possible to solve technical computing problems faster than conventional environments that use traditional programming languages, such as C, C++, and Fortran. MATLAB is used in a wide range of applications, including signal and image processing, communications, control design, test and measurement, financial modeling and analysis, and computational biology. Add-on toolboxes which are collections of special-purpose MATLAB functions may be used to extend the MATLAB environment to solve particular classes of problems in these application areas.

STATEFLOW is an interactive design tool for modeling and simulating event-driven systems. STATEFLOW provides the language elements required to describe complex logic in a natural, readable, and understandable form. It is tightly integrated with MATLAB and SIMULINK and provides an efficient environment for designing embedded systems that contain control, supervisory, or mode logic. STATEFLOW charts enable the graphical representation of hierarchical and parallel states and the event-driven transitions between them. STATEFLOW augments traditional statecharts with capabilities such as control flow, MATLAB and graphical functions, truth tables, temporal operators, directed-event broadcasting, and support for integrating hand-written C code.

SIMULINK is a platform for multi-domain simulation and Model-Based Design of dynamic systems. It provides an interactive graphical environment and a customizable set of block libraries that allows a user to design, simulate, implement, and test control, signal processing, communications, and other time-varying systems. Add-on products extend the SIMULINK domain with tools for specific modeling and design tasks and for code generation, algorithm implementation, test, and verification. SIMULINK is integrated with MATLAB, and provides access to an extensive range of tools for algorithm development, data visualization, data analysis and access, and numerical computation.

In the illustrative embodiment of the present invention, a STATEFLOW model 6 may include a hybrid expression 7 that includes both STATEFLOW and SIMULINK elements. The STATEFLOW elements of the hybrid expression 7 are resolved by the first resolution facility 5 and the results and the at least a portion of remainder of the hybrid expression are then passed to the second resolution facility 12 so that the SIMULINK portions of the hybrid expression can be resolved. Although the illustrative embodiment of the present invention has been discussed as having a first and second modeling domain, those skilled in the art will recognize that additional modeling domains may be involved in the hybrid expression resolution process within the scope of the present invention. The technical computing environment 2 may include three or more modeling domains each of which have a domain-specific resolution facility and each of which are used to evaluate a hybrid expression holding corresponding elements from those domains. It will further be appreciated that although the examples contained herein are described with reference to STATEFLOW and SIMULINK, other modeling domains may be substituted without departing from the scope of the present invention.

The illustrative embodiment of the present invention utilizes hybrid expression evaluation during model initialization. The model initialization process determines the size and type of data, as well as other model properties. Numeric values contained in those properties (size, word length, fixed point scaling or bias, model sample time, etc) may all be specified by an expression. Those expressions may refer to data or properties of data that are known at that time. For example, a data size may be known without its value, and thus its size may be referred to in an expression before the data's value is known.

Continuing to refer to FIG. 1 and using STATEFLOW as an exemplary first modeling domain 4 and SIMULINK as an exemplary second modeling domain 10, the first resolution facility 5 (here a STATEFLOW resolution facility) evaluates expressions in the model 6 during the model initialization process that occurs before a model may be executed/simulated. STATEFLOW models include textual expressions associated with states and transitions.
Examples include:

$k+1$ size(x)
min(size(y), k)

Conventionally, these expressions contain numeric constants, STATEFLOW constants, STATEFLOW parameters and references to the size of other STATEFLOW data and did not support references to other modeling domains. The expressions were completely evaluated in the STATEFLOW domain. The illustrative embodiment of the present invention allows hybrid expressions for various fields in STATEFLOW data, such as size, initial value and min/max values, so that the expressions may also include SIMULINK parameters. For example, given an input data "x" with an inherited size from SIMULINK and an output data "y" the size of y may be defined as:

$$y=\text{size}(x)+\text{delta}$$

where the size(x) is replaced with a size inherited from SIMULINK and the resultant expression is evaluated in the SIMULINK modeling domain after the STATEFLOW domain has resolved its portion of the expression.

Figure 2:
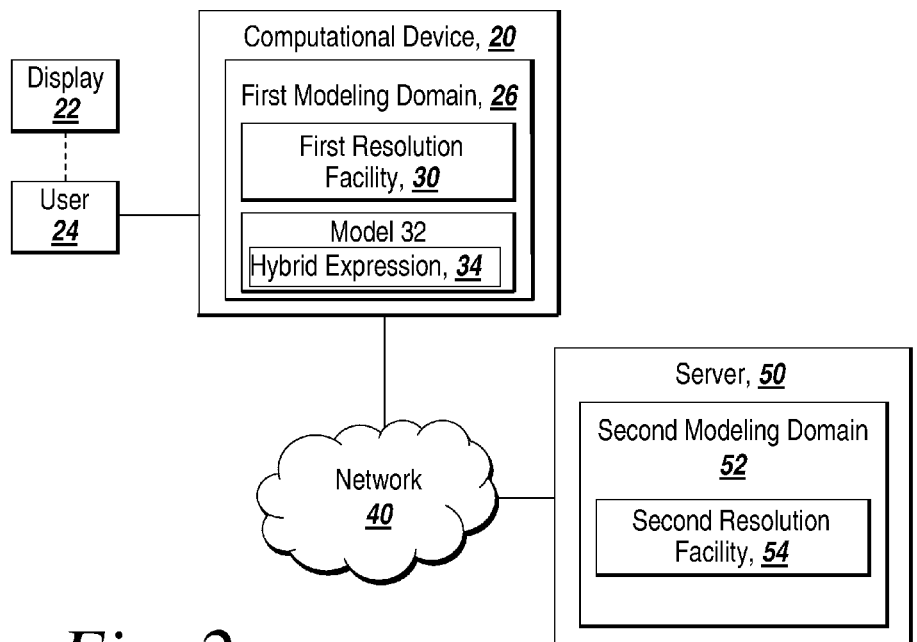
FIG. 2 depicts an alternative distributed environment suitable for practicing the illustrative embodiment of the present invention.

The illustrative embodiment of the present invention may also be practiced using a distributed architecture. FIG. 2 depicts an alternative distributed environment in which a user accesses a computational device 20 communicating with an associated display 22. The computational device 20 hosts a first modeling domain 26 and includes a first resolution facility 30. A model 32 includes a hybrid expression 34 which is dynamically analyzed and partially evaluated by the first resolution facility 30. The computational device 20 is in communication with a server 50 over a network 40. The server 50 hosts a second modeling domain 52 which includes a second resolution facility 54. The second resolution facility 54 resolves an unresolved portion of the hybrid expression 34 which the first resolution facility 30 is unable to resolve. It will be appreciated by those skilled in the art that alternative component architectures that provide similar functionality to those discussed in FIGS. 1 and 2 may be used without departing from the scope of the present invention.

The complete evaluation of the hybrid expression of the present invention requires the transfer of the non-resolved portion of the hybrid expression from the first modeling domain to the second modeling domain. In one implementation, following the resolution by the first resolution facility 5 of the portion of the hybrid expression that is specific to the first modeling domain 4, the unresolved portion is placed in a string and forwarded to the second modeling domain for resolution. In an alternate implementation, both the results of the evaluation of the portion of the hybrid expression specific to the first domain and the non-resolved portion of the hybrid expression are placed in a string and forwarded to the second modeling domain 10.

For example, given the hybrid expression:

$$K3=[\text{size}(k, 1), \text{size}(c_2, 2)]$$

that appears in a STATEFLOW model where k is a STATEFLOW variable and $c_2$ is a SIMULINK parameter, the STATEFLOW resolution facility would resolve the first part of the expression by substituting for k and solving the 'size (k, 1)' portion of the hybrid expression. The STATEFLOW resolution facility would recognize that it was unable to solve for the 'size ($c_2$, 2)' portion of the hybrid expression and place the unresolved portion in a string for forwarding to another (SIMULINK) modeling domain to see if the other modeling domain was able to resolve the remainder of the expression. As noted above, in an alternate implementation, both the results of the resolved portion of the hybrid expression and the non-resolved portion of the hybrid expression may be placed in the string for forwarding to the second modeling domain.

The hybrid expression evaluation engine parses a hybrid expression into a parse tree of variables, literal constants, operators and functions. The variables and functions are then resolved in the parse tree in a bottom up manner, resolving first using the first modeling domain's resolution facility, then the second modeling domain's resolution facility. For functions and variables indexed as matrices, if their inputs have already resolved to the second domain, and literal constants with no names from the first domain, resolution is initially attempted in the second modeling domain. Portions of the expression that are entirely resolved by the first modeling domain are then given as strings to the first modeling domain to evaluate to a numeric value. The numeric values produced by evaluating the strings are substituted into the hybrid expression as literal constant values. At this point entire portions of the hybrid expression that are entirely constant or belonging to the second modeling domain may be transmitted to the second domain for evaluation to a numeric value. This may be repeated by as many domains as necessary, and then iterated through the domains repeatedly as required.

Figure 3:
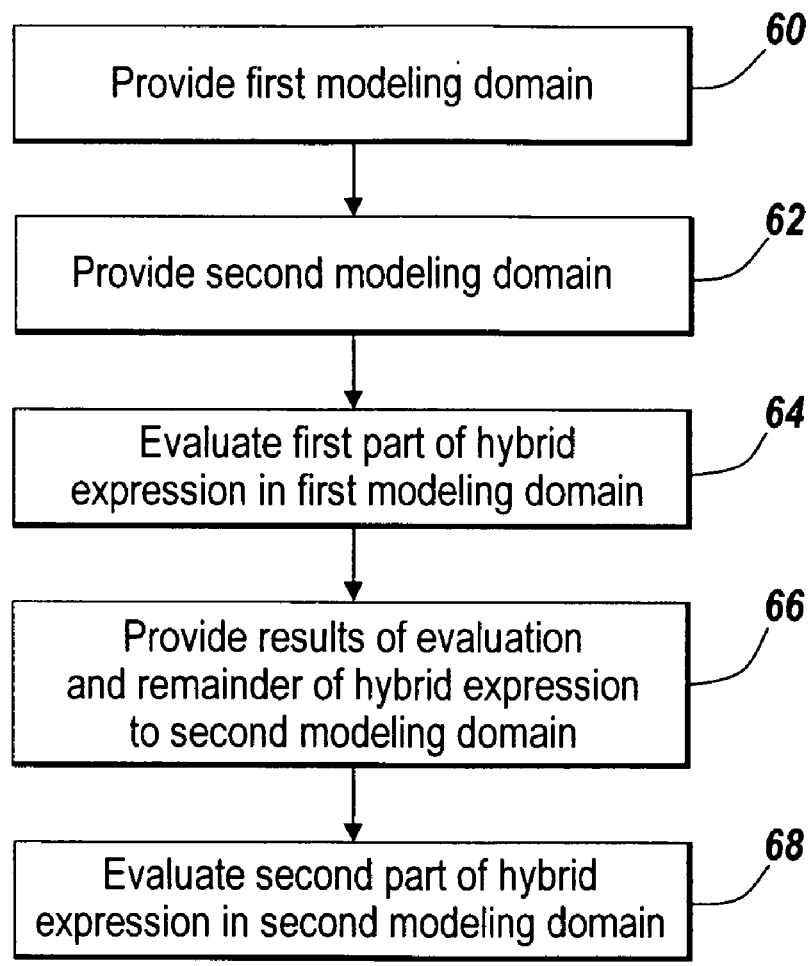
FIG. 3 is a flowchart of the sequence of steps that may be followed by the illustrative embodiment of the present invention to analyze the hybrid expression.

FIG. 3 depicts the sequence of steps followed by the illustrative embodiment of the present invention to evaluate an expression in two modeling domains. The sequence begins by providing a first modeling domain (step 60) and a second modeling domain (step 62). The first part of a hybrid expression that is specific to the first modeling domain is then evaluated (step 64). The results of the evaluation are then provided along with the remainder of the hybrid expression to the second modeling domain (step 66). The second resolution facility then evaluates a portion of the remainder of the second expression in the second modeling domain (step 68). It will be appreciated that the second resolution facility may evaluate the entirety of the remainder of the unevaluated portion of the hybrid expression if the entirety of the remainder is specific to the second modeling domain. Alternatively, the second resolution facility may resolve only a portion of the remainder of the unevaluated portion of the hybrid expression in the event the hybrid expression contains an element from a third modeling domain. In such a case the results of the previous evaluations and the remainder are passed on to the third domain. In an alternative implementation, separate portions of the remainder may be provided in parallel to the second and third modeling domains. Those skilled in the art will recognize that additional modeling domains beyond a third modeling domain may also be utilized.

Figure 4:
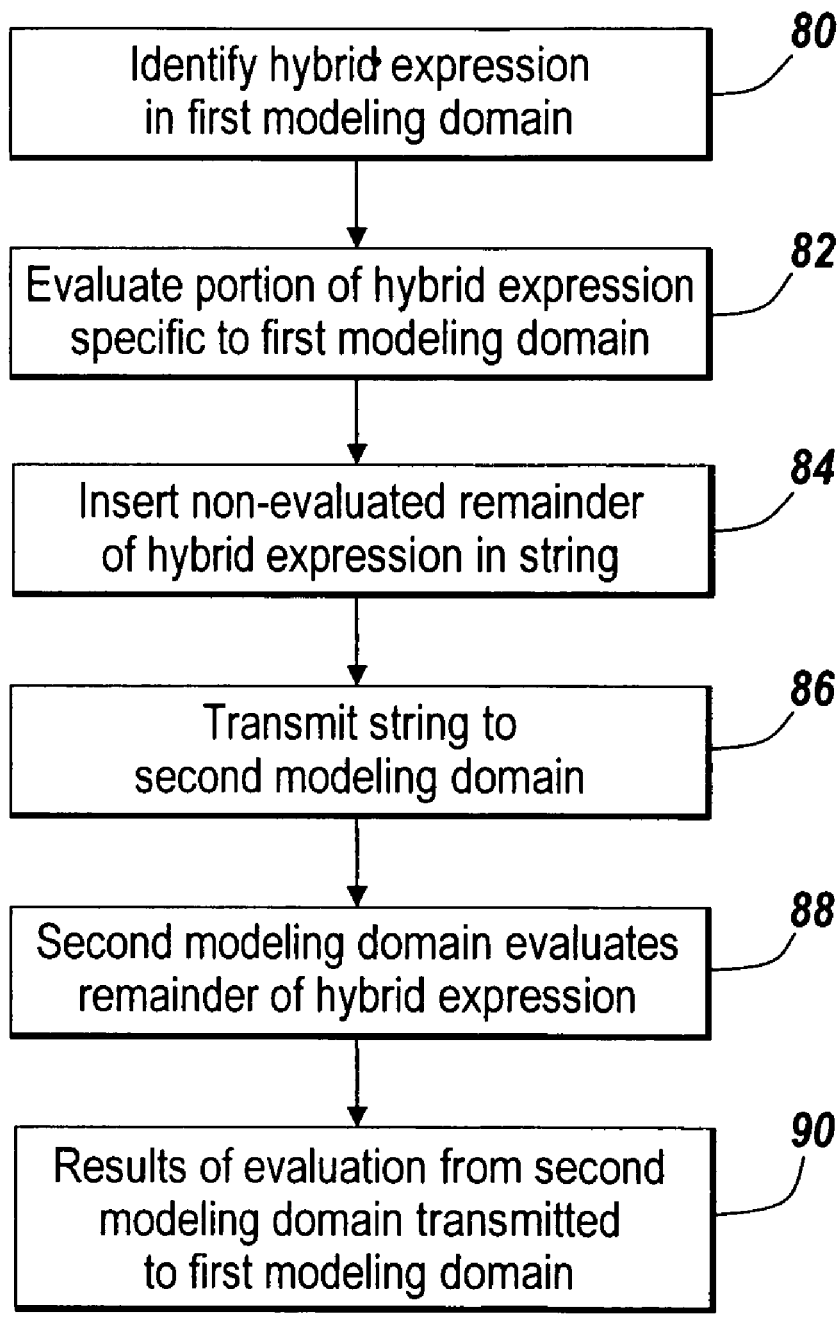
FIG. 4 is a flowchart of the sequence of steps that may be followed by the illustrative embodiment of the present invention to utilize results generated in a second modeling domain in the evaluation of an expression in the first modeling domain.

Instead of finishing the hybrid expression evaluation in the second domain, the illustrative embodiment of the present invention may be implemented so as to finish the evaluation in the original modeling domain. FIG. 4 is a flowchart of the sequence of steps followed by the illustrative embodiment to finish the hybrid expression evaluation in the first modeling domain. The sequence begins with the identification of the hybrid expression in the first modeling domain (step 80). The portion of the expression specific to the first modeling domain is then evaluated (step 82). At least a portion of the non-evaluated portion of the hybrid expression is then inserted in a string (step 84). The string is transmitted to the second modeling domain (step 86) and the second modeling domain evaluates the remainder of the hybrid expression (step 88). The results of the evaluation from the second modeling domain are then transmitted back to the first modeling domain (step 90) where the expression evaluation is finished.

Although the examples above have been discussed with reference to hybrid expressions being evaluated in modeling domains, the present invention may also be utilized outside modeling domain environments. For example, a hybrid expression containing elements written in different programming languages may be resolved using different resolution facilities not located in modeling domains. A hybrid expression containing a first and second element written in different programming languages may be resolved using the techniques discussed above. The first element in the hybrid expression may be resolved in a first resolution facility and the results of the evaluation and the second element may then be provided to a second resolution facility for the completion of the resolution of the hybrid expression.

The present invention may be provided as one or more computer-readable programs embodied on or in one or more mediums. The mediums may be a floppy disk, a hard disk, a compact disc, a digital versatile disc, a flash memory card, a PROM, a RAM, a ROM, or a magnetic tape. In general, the computer-readable programs may be implemented in any programming language. Some examples of languages that can be used include C, C++, C#, M or JAVA. The software programs may be stored on or in one or more mediums as object code. The computer-readable programs may also be implemented completely or partially in hardware, for example, in a field programmable gate array (FPGA).

Since certain changes may be made without departing from the scope of the present invention, it is intended that all matter contained in the above description or shown in the accompanying drawings be interpreted as illustrative and not in a literal sense. Practitioners of the art will realize that the sequence of steps and architectures depicted in the figures may be altered without departing from the scope of the present invention and that the illustrations contained herein are singular examples of a multitude of possible depictions of the present invention.

I claim:

1. A method of performing hybrid expression evaluation while processing a computer-model of a system, comprising:
   providing a first modeling domain on a first computational device, the first modeling domain being a type of modeling domain that is a statechart modeling domain or a block diagram modeling domain;
   providing access from the first modeling domain to a second modeling domain, the second modeling domain executing on the first computational device or a second computational device, the second modeling domain being a different type of modeling domain from the first modeling domain and being a statechart modeling domain or a block diagram modeling domain;
   evaluating a first part of a hybrid expression in a model of a system in the first modeling domain using a first resolution facility, the hybrid expression being a single expression including at least one expression element from the first modeling domain and at least one expression element from the second modeling domain;
   providing at least a portion of a remainder of the hybrid expression to the second modeling domain, the remainder including the at least one expression element from the second modeling domain; and
   evaluating, in the second modeling domain, a second part of the hybrid expression from the remainder of the hybrid expression.

2. The method of claim 1 wherein the second part of the hybrid expression is the remainder of the hybrid expression.

3. The method of claim 1 wherein the providing of the remainder of the hybrid expression to the second modeling domain further comprises:
   placing the remainder of the hybrid expression in a string; and
   providing the string to the second modeling domain.

4. The method of claim 1, further comprising
   providing, following the evaluation of the remainder of the hybrid expression by the second modeling domain, the results of the evaluation of the hybrid expression by the second modeling domain to the first domain.

5. The method of claim 1 wherein the hybrid expression being evaluated in the first modeling domain includes a value for one of the group of a size parameter, an initial value, or a minimum or maximum value that is inherited from the second modeling domain.

6. The method of claim 1 wherein the hybrid expression includes a third modeling domain and the results of the evaluations performed in the first and second modeling domain are passed to the third modeling domain.

7. The method of claim 1 wherein at least one expression element in the hybrid expression is a variable.

8. The method of claim 1 wherein at least one expression element in the hybrid expression is data.

9. A system for performing hybrid expression evaluation while processing a computer model, comprising:
   a first modeling domain executing on a first computational device, the first modeling domain being a type of modeling domain that is a statechart modeling domain or a block diagram modeling domain, the first modeling domain including a first resolution facility, the first resolution facility evaluating a first part of a hybrid expression in a model of a system, the hybrid expression being a single expression including at least one expression element from the first modeling domain and at least one expression from a second modeling domain; and
   the second modeling domain executing on the first computational device or a second computational device, the second modeling domain receiving at least a portion of a remaining non-evaluated portion of the hybrid expression, the remaining non-evaluated portion of the hybrid expression including the at least one expression element from the second modeling domain, and evaluating a second part of the remaining non-evaluated portion of the hybrid expression with a second resolution facility, the second modeling domain being a different type of modeling domain from the first modeling domain and being a statechart modeling domain or a block diagram modeling domain.

10. The system of claim 9, comprising further:
    a third modeling domain, the third modeling domain receiving the results of the evaluations performed in the first and second modeling domains and performing further evaluation on the hybrid expression.

11. The system of claim 9 wherein the non-evaluated portion of the hybrid expression is inserted into a string before being provided to the second modeling domain.

12. The system of claim 9 wherein the results of the evaluation performed in the second modeling domain are transmitted to the first modeling domain.

13. A non-transitory medium holding computer-executable instructions for a method of hybrid expression evaluation while processing a computer model of a system, the instructions when executed causing at least one computational device to:
    provide a first modeling domain on a first computational device, the first modeling domain being a type of modeling domain that is a statechart modeling domain or a block diagram modeling domain;
    provide access to a second modeling domain, the second modeling domain executing on the first computational device or a second computational device, the second modeling domain being a different type of modeling domain from the first modeling domain and being a statechart modeling domain or a block diagram modeling domain;
    evaluate a first part of a hybrid expression in a model of a system in the first modeling domain using a first resolution facility, the hybrid expression being a single expression including at least one expression element from the first modeling domain and at least one expression element from the second modeling domain;

provide at least a portion of a remainder of the hybrid expression to the second modeling domain, the remainder including the at least one expression element from the second modeling domain; and evaluate a second part of the hybrid expression from the remainder in the second modeling domain.

14. The medium of claim 13 wherein the second part of the hybrid expression is the remainder of the hybrid expression.

15. The medium of claim 13, wherein the execution of the instructions further cause at least one computational device to:

provide, following the evaluation of the remainder of the hybrid expression by the second modeling domain, the results of the evaluation of the hybrid expression by the second modeling domain to the first domain.

16. The medium of claim 13 wherein the hybrid expression includes a third modeling domain and the results of the evaluations performed in the first and second modeling domain are passed to the third modeling domain.

17. The medium of claim 13 wherein at least one expression element in the hybrid expression is a variable.

18. The medium of claim 13 wherein at least one expression element in the hybrid expression is data.

* * * * *